(12) United States Patent
Anderson et al.

(10) Patent No.: US 9,707,758 B2
(45) Date of Patent: Jul. 18, 2017

(54) LAMINATE CONSTRUCTS FOR MICRO-FLUID EJECTION DEVICES

(71) Applicant: FUNAI ELECTRIC CO., LTD, Osaka (JP)

(72) Inventors: Frank Edward Anderson, Lexington, KY (US); Richard Earl Corley, Lexington, KY (US); Michael John Dixon, Lexington, KY (US); Jiandong Fang, Lexington, KY (US); Jeanne Marie Saldanha Singh, Lexington, KY (US)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 14/869,583

(22) Filed: Sep. 29, 2015

(65) Prior Publication Data

US 2016/0016406 A1    Jan. 21, 2016

Related U.S. Application Data

(63) Continuation of application No. 14/098,325, filed on Dec. 5, 2013, now Pat. No. 9,144,969, and a
(Continued)

(51) Int. Cl.
*B41J 2/14*    (2006.01)
*B41J 2/16*    (2006.01)

(52) U.S. Cl.
CPC ............. *B41J 2/1433* (2013.01); *B41J 2/14* (2013.01); *B41J 2/14072* (2013.01);
(Continued)

(58) Field of Classification Search
None
See application file for complete search history.

(56) References Cited

U.S. PATENT DOCUMENTS 6,126,273 A * 10/2000 Van Vooren ............... B41J 2/14
                                                     347/54
6,821,819 B1    11/2004 Benavides et al.
(Continued)

OTHER PUBLICATIONS

Ansgar Wego, Stefan Richter, Lienhard Pagel, "Fluid microsystems based on printed circuit board technology," Journal of Micromechanics and Microengineering, Nov. 2001, pp. 528-531, IOP Publishing Ltd., United Kingdom.
"What is Stablcor Material?", Technology Presentation, www.stablcor.com, pp. 7, 13, 14, 17, 54, 55, printed Apr. 23, 2010.

*Primary Examiner* — Erica Lin
(74) *Attorney, Agent, or Firm* — Amster, Rothstein & Ebenstein, LLP

(57) ABSTRACT

A micro-fluid ejection head has an ejection chip to expel fluid. It connects to a laminate construct. The construct has vertically configured wiring layers interspersed with non-conductive layers, such as carbon fiber layers. An upper of the wiring layers electrically connects to the ejection chip. The upper layer may also support a planar undersurface of the chip directly on a surface or in a recessed pocket. The two can connect with a die bond, such as one having silica or boron nitride. Fluid connections exist between ink feed slots of the chip and the laminate construct. A silicon tile or other material may also fluidly interconnect with the two. A plastic manifold optionally supports the laminate construct and may fluidly connect to it. The wiring layers of the laminate contemplate ground, power, and various bond pads. Other construct layers contemplate prepreg or core FR4 layers.

9 Claims, 10 Drawing Sheets

Related U.S. Application Data continuation of application No. 12/788,462, filed on May 27, 2010, now Pat. No. 8,622,524.

(52) U.S. Cl.
CPC ........... *B41J 2/1601* (2013.01); *B41J 2/1623* (2013.01); *B41J 2/1626* (2013.01); *B41J 2/1632* (2013.01); *B41J 2/1634* (2013.01); *B41J 2/1643* (2013.01); *B41J 2002/14419* (2013.01); *B41J 2002/14491* (2013.01); *B41J 2202/20* (2013.01)

(56) References Cited

U.S. PATENT DOCUMENTS

| | | |
|---|---|---|
| 7,347,533 B2 | 3/2008 | Elrod et al. |
| 7,681,991 B2 | 3/2010 | Anderson et al. |
| 8,109,612 B2 | 2/2012 | Kojima et al. |
| 2003/0035025 A1 | 2/2003 | Pan |
| 2003/0184618 A1 | 10/2003 | Childers et al. |
| 2006/0077221 A1 | 4/2006 | Vaideeswaran et al. |
| 2007/0126773 A1 | 6/2007 | Anderson et al. |
| 2007/0139475 A1 | 6/2007 | King et al. |
| 2007/0236542 A1* | 10/2007 | Graham ............... B41J 2/14024 347/70 |
| 2008/0316274 A1 | 12/2008 | Kondo |

* cited by examiner

LAMINATE CONSTRUCTS FOR MICRO-FLUID EJECTION DEVICES

FIELD OF THE INVENTION

The present invention relates to micro-fluid ejection devices, such as printers, copiers, graphics plotters, all-in-ones, etc. More particularly, it relates to laminate constructs serving multiple functions that minimize the number of components, processing steps and size required for ejection heads, e.g., inkjet printheads.

BACKGROUND OF THE INVENTION

The art of printing images with micro-fluid technology is relatively well known. A conventional permanent or semi-permanent ejection head has access to a local or remote supply of fluid. The fluid ejects from an ejection zone of the head to a print media in a pattern corresponding to pixels of images being printed. Over time, the heads and fluid drops have become smaller.

As part of recent trends, manufacturers increasingly have placed their inkjet ejection chips on ceramic substrates. Ceramics are relatively high modulus materials offering low coefficients of thermal expansion (CTEs). They are known to minimize chip bow in comparison to dies mounted directly on molded plastic substrates, especially when using epoxy die bond materials having elevated cure temperatures (typically in the range 110.degree.-150.degree. C.). In multi-chip, wide-swath ejection heads, ceramics provide benefit during thermal processing steps subsequent to preliminary die-to-substrate attachment, such as by maintaining a die's relative position during encapsulation cure, printed circuit board (PCB) attachment cure, wire bonding, etc.

Notwithstanding these advantages, ceramics have known drawbacks. One, manufacturers need to set dimensional tolerances fairly high since ceramics shrink during firing processes. As it stands, placement accuracies are compromised for fluid (ink) vias and bridges and their locations relative to each other and to components residing near terminal edges. Dry-pressed ceramics have typical tolerances of +/−200 .mu.m while those from more expensive ceramic injection molding (CIM) processes are smaller. Two, ceramics based in alumina have limited thermal conductivity and most do not incorporate any electrical functionality unless founded in tape cast varieties, such as HTCC (94-98% alumina) and LTCC (.about.40% glass in alumina). Tape cast varieties, however, are relatively expensive to fabricate and each comes with challenges in selecting compatibility relative to other materials. For instance, one grade of LTCC material examined by the inventors caused ink to flocculate, while selected HTCC materials required correspondingly low-conductivity trace (metal) materials, such as tungsten, when utilized in high-temperature firing environments. Three, there exists a practical limitation in the sizes of substrates that can be fabricated due to corresponding limitations in the sizes of modern presses. Naturally, this creates problems for manufacturers seeking to increase dimensions in printing swaths and chip arrays.

With reference to FIG. 1A, an ejection head 10 is formed with a PCB 12 and flexible cable 14. The PCB embodies a four wiring layer board and mounts on a ceramic substrate 16. The board provides electrical connections to ejection chips that reside in cutout "pockets" 18. The design adds electrical functionality over earlier, single layer TAB circuit, flexible circuit, solutions due to its presence of ground and power planes in the four wiring layers and an ability to combine and cross signal lines. When the PCB is configured with a material set of FR4 (the international grade designation for "Flame Retardant" (FR) fiberglass reinforced epoxy laminates), the design has further advantage in its compatibility with certain ink sets. However, there remains limits and unresolved process challenges as will be seen.

For example, a depth of the pocket 18 cannot be thicker than the chip it carries or material of the board will encroach into a paper gap distance of the ejection device. Also, the thickness of the PCB is best situated to remain .about.100 um lower than the chip surface to help minimize wire bond loop heights above the head's nozzle plate. However, a chip thickness of 450 .mu.m limits the thickness of the board to no more than 350 .mu.m (.about.14 mils) (e.g., 450 .mu.m-100 .mu.m). In a four (4) wiring layer board (e.g., wire bond pads on top, internal power and ground planes, routing interconnections and solder pads for flexible cable interconnect on bottom), this keeps the thickness of the board critically close to a minimum thickness of a board that can be made. It also limits the space to add a protective FR4 layer to the bottom of the board, such as over trace areas so that the only exposed metal on the bottom is for flexible cable attachment pads. By allowing a thicker die, on the other hand, the board thickness can increase but at an adverse cost to the substrate of poorer thermal dissipation.

In other setbacks, current corrosion protection for wiring traces is provided by an adhesive that attaches the board 12 to the ceramic substrate 16. However, since the boards are thin and flexible, they tend to warp after fabrication. This not only presents challenges for attaching the board to the ceramic, but compromises corrosion protection for the traces. Still other problems associated with board-to-ceramic attachment include: 1) squeezing epoxy excesses into the chip pocket causing, thereby interfering with later die mounting or contributing to volume variability in the pocket and making encapsulation heights unpredictable; or 2) creating interfacial voids that allow ink to access the delicate wiring traces on the bottom of the board.

Alignment or registration between the board and ceramic has also resulted in manufacturing concerns. One, the board warping makes it difficult to properly register components. Two, routing tolerances on the board provide little room to adjust components. Three, vision system pick-and-place fixtures require holding one piece steady while attaching the other with adhesive. As ejection heads move beyond single- or double-chip heads to larger arrays, the weight of now larger ceramics becomes problematic for smaller pick-and-place tools. Then, once placed, the board and ceramic must be fast-tacked during a preliminary cure step for transfer to a more permanent cure. However, UV curing lamps and other gluing fixtures are difficult to incorporate into standard tooling. Also, selections of compatible tack-and-hold and permanent bonding adhesives need be contemplated when making tooling selections. While none of the problems are individually insurmountable, a need exists in the art to simplify the process.

As part of solutions to the foregoing problems, third parties have introduced various epoxy based PCB's. They are thought to provide electrical functionality in low cost manufacturing items. They also sidestep many of the ceramic limitations noted above. Some have even been used as substrates for micro-fluidic applications. For example, U.S. Pat. No. 6,821,819 proposes using a PCB as a substrate and fluidic manifold for a microfluidic device chip like a biosensor, chemical sensor, or other electro microfluidic device. In U.S. Pat. No. 7,347,533, a piezoelectric inkjet printhead is constructed from a PCB material with driver chips affixed to the board. Neither of these, however, concern themselves with the challenges associated with precision methods needed to attach silicon inkjet chips to PCB materials. Rather, they relate to using conventional PCB material sets, which are insufficient for modern concerns.

When ejection head designs use a thermally cured adhesive, chip bow is affected by the modulus, CTE and thickness of the die, substrate, and adhesive together with the glass transition temperatures of these materials and the delta T between cure temperature and ambient. Using high Tg substrates with low CTEs are the better product for less stress on the die. Typical FR4 PCB materials, however, have CTEs of .about.16-20 ppm/.degree. C. and represent poor substrates for attachment to silicon chips having CTEs of 2-4 ppm/.degree. C. While ceramic materials with CTEs of 6-8 ppm/.degree. C. are a better match, they suffer the problems identified above. Also, standard FR4 based circuit boards may not provide enough rigidity/stiffness for micro-fluid applications. In turn, mounting a board assembly to a printhead body can induce significant stresses that may translate into deformation where the die interfaces with the FR4 substrate. Further, thermal conductivities of standard FR4 materials are very low when compared to ceramic (0.3-0.4 W/mK vs. .about.25 W/mK), and this could prove challenging for dissipating heat generated during printing.

In other modern designs, page-wide ejection heads are contemplated having arrays of very narrow ejection chips (<2 mm). Each chip includes multiple minute through holes feeding ink to each firing chamber instead of a single large via feeding ink. In comparison to larger conventional chips, the design enjoys more efficient use of silicon since large "real estate" need not be consumed by structurally supporting the large via or providing fluidic channels to each firing chamber. Instead, fluidic channels are confined to manifolds above and/or below the layers of patterned silicon on the chip. For one of many competing proposals on how best to construct the manifold, see, e.g., U.S. patent application Ser. No. 12/624,078, filed Nov. 23, 2009, incorporated herein by reference.

With reference to FIG. 4, an initial concept is seen for establishing fluidic and electrical interconnections in the '078 application. It includes an ejection chip and fluid manifold (silicon) 20. The ejection chip and manifold may be fabricated in a single piece of silicon or they may be separate pieces of silicon bonded in a laminar construct. The fluid manifold portion of this construct consists of fluid channels running the long axis of the chip, typically one per color of ink or per row of nozzles. The chip wire bonds 22 electrically to a printed circuit board 24. The board connects to a flexible circuit 26 which connects to printer electronics (not shown). Fluidically, the manifold communicates with a tile 28. The tile is silicon-based (absent thin film patterned layers) and has a thickness of about 400-600 .mu.m. Its manufacturing and interface to the manifold is more thoroughly described in U.S. patent application Ser. No. 12/568,739, filed Sep. 29, 2009, and such is also incorporated herein by reference. In general, however, the tile has ports on its top that fluidly mate with slots on the bottom of the manifold. It also has lateral channels at its bottom (orthogonal to the long axis of the ejection chip) that fluidly connect in stagger to through holes in a rigid substrate 30 (e.g. ceramic base). The substrate, in turn, provides both mechanical support and rigidity to the overall assembly. Ultimately, the goal of the fluidic arrangement is to fan-out the fluidic channels downward from the chip and condense them into a single port connection for each color. However, the design needs a "large enough" separation/seal distance so that a fluidic feed tube or plastic housing can be easily connected with a compliant rubber gasket or a needle-dispensed liquid adhesive. For adhesives typically used in micro-fluidic connections, the minimum achievable seal distances with needle dispense, without having either leaks, and crosstalk, between colors or excessive adhesive "squeeze-out" causing blockages in fluidic paths has been established as approximately 500 .mu.m of "land area" between adjacent fluidic features. Unfortunately, the printed circuit board 24 and ceramic base substrate 30 cause the design to encounter much of the same problems earlier described.

Accordingly, a further need exists in the art to accommodate pluralities of components in ejection heads having diverse functionality. Additional benefits and alternatives are also sought when devising solutions.

SUMMARY OF THE INVENTION

The above-mentioned and other problems become solved with laminate constructs for micro-fluid ejection heads. Broadly, the concept proposes to combine the mechanical substrate function of a ceramic base with the electrical function of a PCB. It eliminates the expense of a ceramic component and minimizes challenges to attaching PCBs. It also avoids thermal curing stresses on the PCB-flex joint/seal or all-flex wiring assembly.

A micro-fluid ejection head has an ejection chip to expel fluid toward a print media during use. It connects to a laminate construct. The construct has vertically configured wiring layers interspersed with non-conductive layers, such as carbon fiber layers. An upper of the wiring layers electrically connects to the ejection chip. The upper layer may also support a planar undersurface of the chip directly on a surface or in a recessed pocket. The two can connect with a die bond, such as one having silica or boron nitride. Fluid connections exist between ink feed slots of the chip and laminate construct. A silicon tile or other material may also fluidly interconnect with the two. A plastic manifold optionally supports the laminate construct and may fluidly connect to it. The wiring layers of the laminate construct representatively include ground, power, and bond pads. Other construct layers representatively include prepreg or core FR4 layers.

In any embodiment, the ejection head is configured without sacrificing CTE match, stiffness/rigidity, or thermal conductivity. It does so by taking advantage of recent developments in carbon fiber PCB laminate technology to address some key drawbacks of traditional PCB/FR4 material sets as they apply to inkjet printhead construction. Due to large laminate panel processing in common usage at board manufacturers, a PCB approach is more easily extensible to larger form factors (and page-wide ejection heads) than is a ceramic approach limited to those shapes/sizes that can be easily molded using dry pressing or ceramic injection molding. The use of a Stablcor™ carbon fiber laminate PCB is but one representative embodiment of a laminate construct that is useful in replacing the functionality of a ceramic substrate and PCB electrical interconnect component.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE ILLUSTRATED EMBODIMENTS

In the following detailed description, reference is made to the accompanying drawings where like numerals represent like details. The embodiments are described in sufficient detail to enable those skilled in the art to practice the invention. It is to be understood that other embodiments may be utilized and that process, electrical, and mechanical changes, etc., may be made without departing from the scope of the invention. The following detailed description, therefore, is not to be taken in a limiting sense and the scope of the invention is defined only by the appended claims and their equivalents. In accordance with the present invention, methods and apparatus describe a laminate construct for an ejection head useful in micro-fluid ejection devices.

Figure 1A:
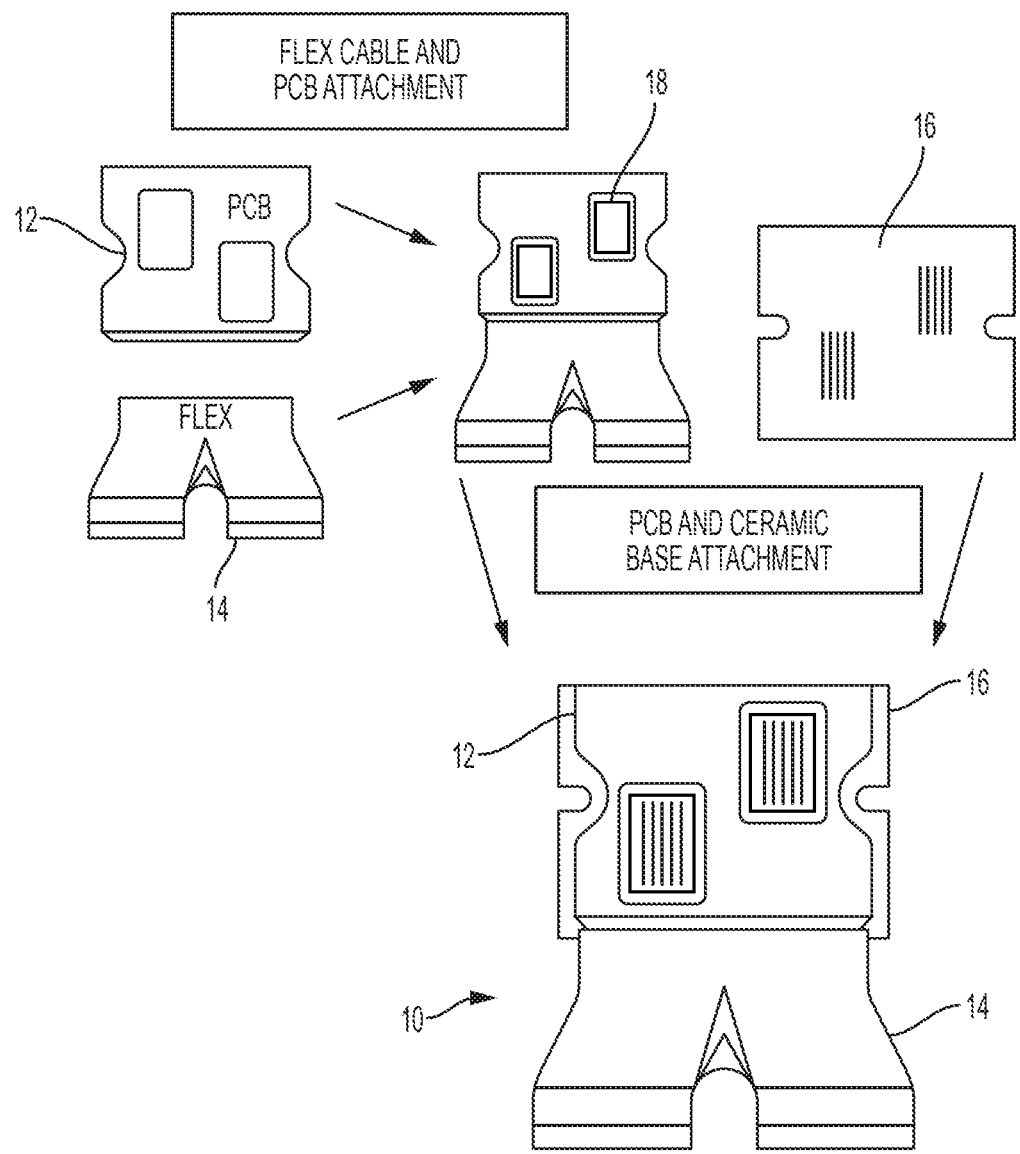
FIG. 1A is a diagrammatic view in accordance with the prior art of a PCB and ceramic base attachment for an ejection head.
Figure 1B:
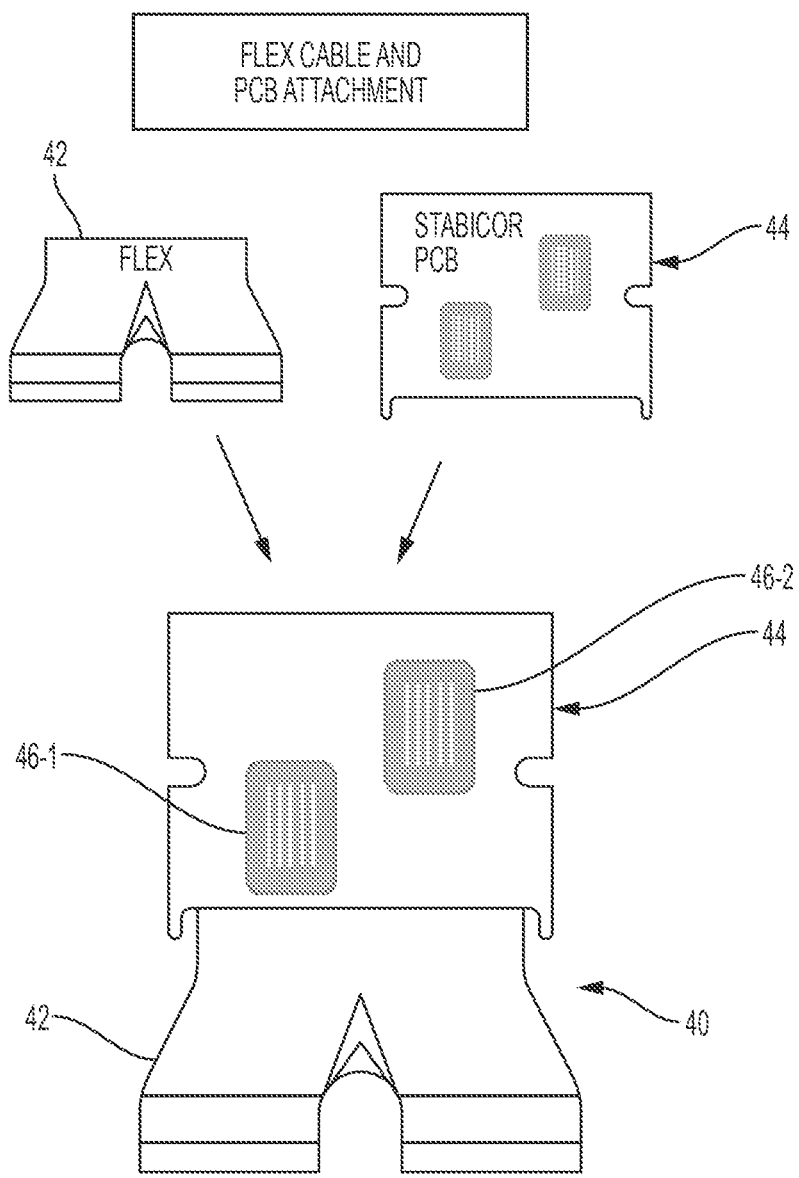
FIG. 1B is a diagrammatic view in accordance with the present invention of a laminate construct for a micro-fluid ejection head.

With reference to FIG. 1B, a representative ejection head 40 includes a flexible cable 42 and a laminate construct 44. The laminate construct supports one or more ejection chips 46-1, 46-2 that eject fluid toward a print media during use. The laminate construct replaces the PCB and ceramic substrate components of FIG. 1B, and their functionality. Ultimately, it provides a rigid, lightweight, CTE matched, thermally conductive substrate with electrical wiring/interconnect. Robust corrosion protection is also afforded by having eliminated the adhesive interface between the PCB and ceramic and its associated trace protection requirements on the adhesive at this same location. In process, it avoids the challenging assembly step and thermal cure cycle of PCB-to-ceramic attachment. Further, thermal dissipation is improved versus plastic or ceramic bases, as will be seen.

Figure 2:
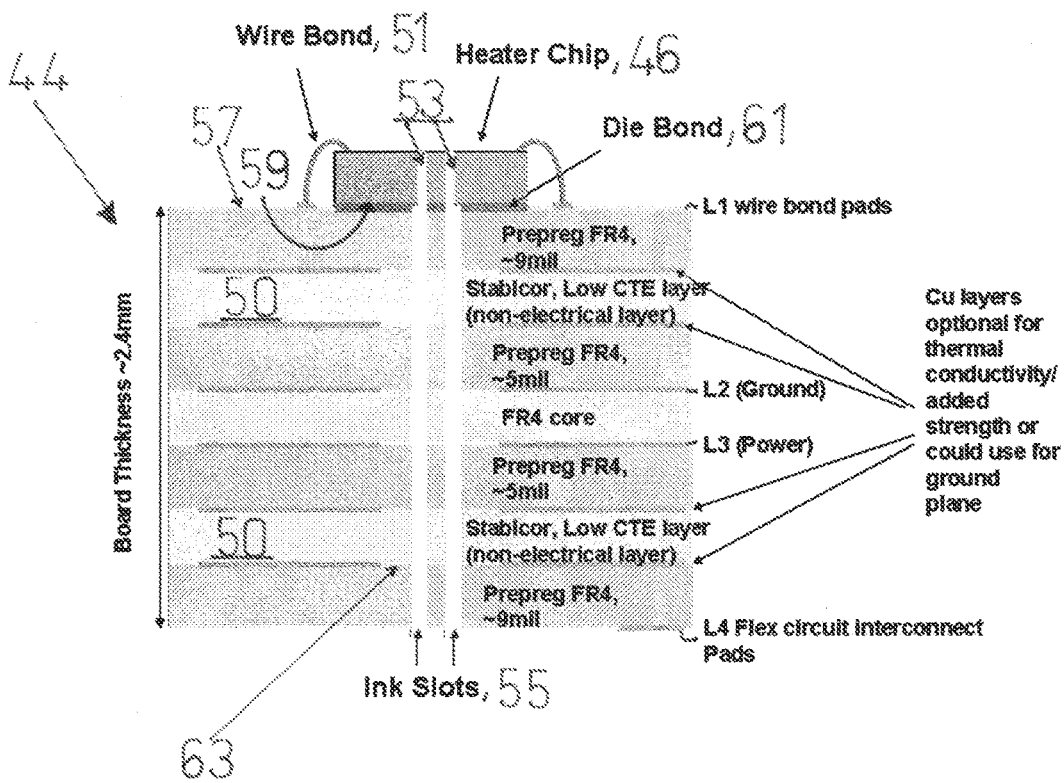
FIG. 2 is a diagrammatic view in accordance with the present invention of a more detailed laminate construct.

In a more detailed design in FIG. 2, the laminate construct embodies a plurality of vertically stacked wiring layers (L1, L2, L3, L4) interspersed with non-conductive layers (prepreg, FR4 core and carbon-fiber based layers 50). An upper layer L1 of the wiring layers electrically connects to the ejection chip 46, such as by wire bonding 51. Each ejection chip 46 and the laminate construct have fluid flow features, e.g., ink feed slots 53, 55, in fluid communication with one another to convey fluid from a reservoir (not shown) through the laminate construct and into the ejection chip during use. Also, the upper layer defines a substantially planar surface 57 for supporting a substantially planar undersurface 59 of the ejection chip. Alternatively, the upper layer may define a recess or pocket for supporting the chip (described in more detail below, FIG. 7). With either, a die bonding material 61 is further useful to secure movement between the two structures. Optional copper (Cu) layers in the construct 44 may further enhance thermal conductivity of the design and/or add strength. Because of its conductivity, one or more of the Cu layers may define an electrical plane, such as ground.

A particularly useful carbon fiber layer 50 for use in the laminate construct is a Stablcor® brand composite laminate board. Alternatively, an entirety of the laminate construct 44 can typify one or more Stablcor boards. In the example given, two layers of Stablcor material (not electrically functional) are included in a laminate structure with the four wiring layers. The two Stablcor layers are separated from one another and are balanced around the neutral axis of the board to impart stiffness.

A thickness of the laminate construct varies, but is seen here in a range of about 2-3 mm, especially 2.4 mm. Its inner layers of prepreg FR4 are relatively thinner than its outer layers of prepreg FR4. The inner layer is about 5 mils, while the outer is about 9 mils. The core FR4 layer, on the other hand, is about 50 mils and each of the carbon-fiber based layers typify about 9-18 mils. Of course, other sizes are possible.

The fluidic features in the construct (ink slots 55) are fabricated with a variety of techniques, but representative processes include standard PCB fabrication techniques, such as routing, drilling, punching, or other cutting process (e.g., laser, waterjet, etc.). Similarly, the ink slots 53 in the chip 61 are traditionally formed, such as by etching, grit blasting, or the like. The features are shown as slots in both the chip and construct, but could further embody fluid ports, holes, etc., to enable connection to manifolds, described below, and those seen in the earlier patent applications incorporated by reference. When embodied as shown, drill sizes as small as 6 mils are commonly available for tooling which lends itself to location tolerances of +/−2 mils over a panel as large as 18".times.24". Milled slots are also possible, but with slightly larger tolerances being on the order of about +/−3 mils. Either compares favorably to dry-pressed ceramic components having typical tolerances of about +/−8 mils. The Cu layers of the construct can be imaged and patterned as needed. This allows copper to be pulled back from nearby cut edges that reside closely to ink flows, such as nearby position 63.

Figure 3A:
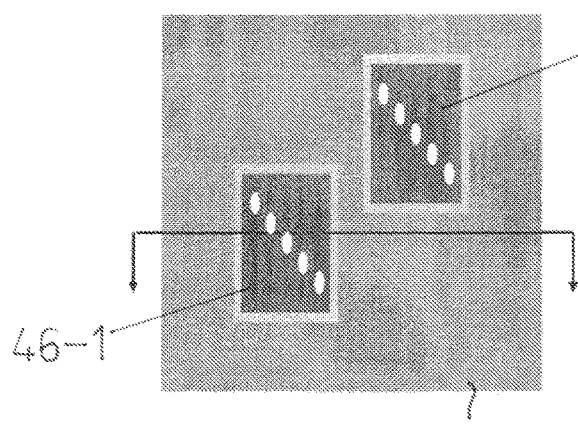
FIGS. 3A and 3B are diagrammatic views in accordance with the present invention of an alternate design for a laminate construct including attached fluid flow features for an ejection head.
Figure 3B:
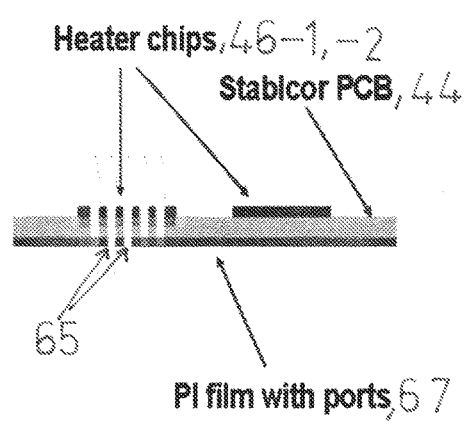

In other embodiments, narrow flow features 65 can be fabricated on the backside of the construct, instead of slots, by way of laser cutting or punched-film (such as polyimide (PI) film 67) and then attached with an adhesive (such as an epoxy) as represented in FIGS. 3A and 3B. In still another option, a two step routing process contemplates first milling slots partway through the laminate construct and then forming ports/narrow flow features through the remainder of the board. Alternatively still, a narrow flow feature including a taper/funnel profile to avoid bubble entrapment points could be molded in a plastic component and then attached to the back of the laminate construct with an adhesive. Various plastic embodiments will be seen below.

In any design, the carbon-fiber laminate boards developed by Stablcor have been recently demonstrated to allow CTEs to be tailored over the range of 3-12 ppm/.degree. C. As is known, the carbon fiber composite layers consist generally of a carbon fiber weave in an epoxy matrix. The layer is electrically and thermally conductive and can be used as a ground (or power) plane and/or for thermal dissipation. A main difference in comparison to a standard FR4 core is that the FR4's glass fibers are replaced with carbon fibers. The weave pattern is also balanced with an equal number of fibers in the X and Y axes. In this way, electrical and thermal conduction properties are anisotropic with highest conduction rates occurring along the X and Y axes.

As is reported by Stablcor at its website www.stablcor.com, for instance, there are several grades of carbon fiber laminate cores from which to choose. In one embodiment, ST10 and ST325 grades are available with the CTE benefits noted above. Their thermal conductivities are reported as 8 and 325 W/mK, respectively. When including copper cladding, their conductivities are 75 and 175 W/mK, respectively. In comparison to a substrate of ceramic at a thermal conductivity of .about.25 W/mK, the carbon fiber layers are favorable.

Similarly, the tensile moduli of Stablcor layers are favorable over PCBs as noted three to seven times higher than that of standard FR4/E-glass layers. When multiple such carbon-fiber layers are built into a single laminate construct, an added advantage is that of dramatically increased flexural modulus. As touted, Stablcor claims an increase of more than two times the flexural modulus of a standard FR4 PCB depending on how many Stablcor layers are used, their thickness, and relative location in the "stack-up." Because their densities are similar to that of traditional PCB materials and much lower than ceramic materials, the proposed weight of the final assembly in FIG. 1B, for example, is much lighter than that of the prior art design in FIG. 1A. This is of further importance in a micro-fluid ejection device where the ejection heads scan back and forth over a media during use since it reduces momentum/inertia of the head carriage.

Lastly, the laminate constructs including or typifying an entirety of Stablcor layers are at lower risk for brittle fracture in comparison to ceramics. In turn, better mechanical damping is afforded ejection chips 46, thereby lower the risk of damage during shipping and handling.

Example

As an initial proof of concept, the inventors have mounted dies on several Stablcor layers of the above construction using the same die bond material, dispense, and pick-and-place processes used on conventional ceramic substrate designs. Thickness were somewhat arbitrarily set and design and process conditions were not optimized for planarity in the chip pocket area. Result: Y-axis chip bows were observed at less than 5 .mu.m over a ½ inch chip length. While such is not as good as the 1-2 .mu.m achieved on ceramic substrates, it is considerably better than the 15-16 .mu.m achieved on other designs (not shown). It is believed that with the optimization of planarity between the chip and laminate construct, results will be further improved.

Figure 4:
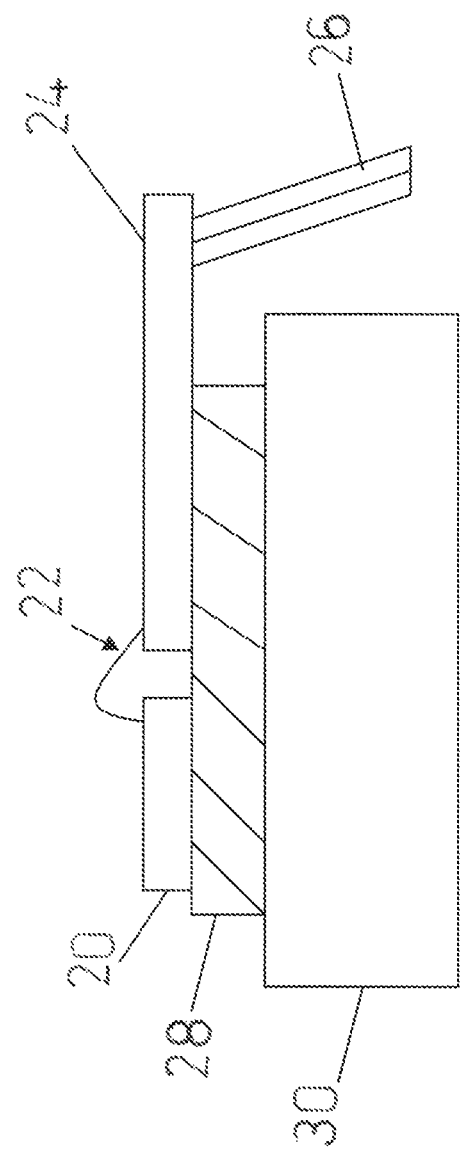
FIG. 4 is a diagrammatic view in accordance with the prior art of an alternate design of a PCB and ceramic base attachment for an ejection head.

With reference to FIGS. 5-9, the laminate construct 44 is further useful in overcoming the disadvantages of the design in FIG. 4 (prior art). In all such embodiments, the laminate constructs are intended to provide fluidic and electrical interconnections to very narrow ejection chips for use in devices such as wide swath printheads. Also, the ejection heads can be defined as either a single monolithic substrate or in a modular construction where construction contemplates many such monolithic substrates.

Figure 5:
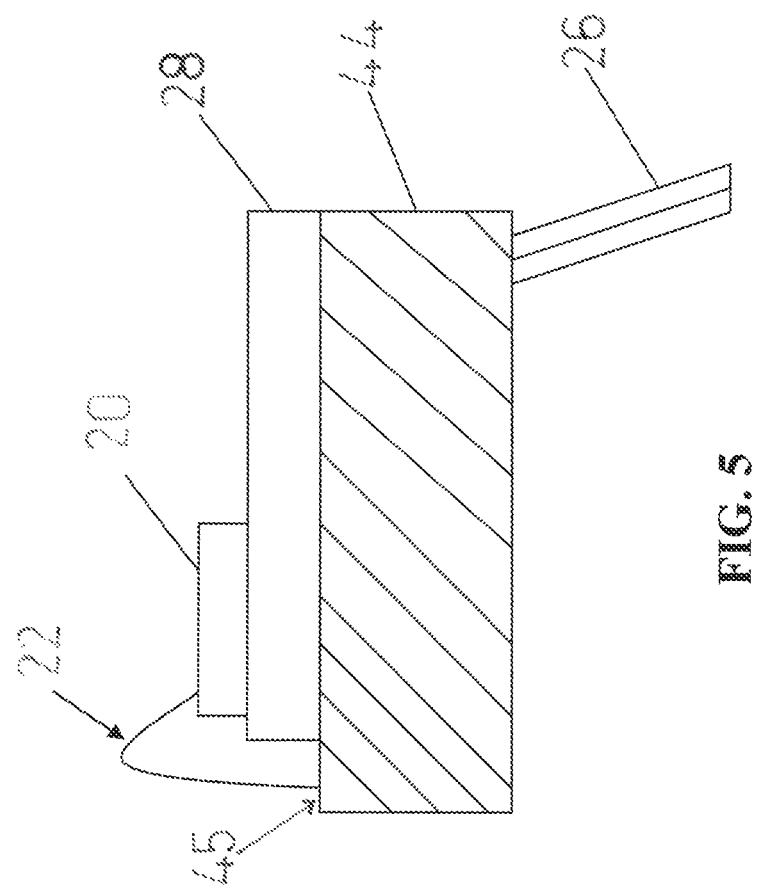
FIGS. 5-9 are diagrammatic views in accordance with the present invention of other alternate laminate construct designs for micro-fluid ejection heads.

As seen in FIG. 5, a first embodiment utilizes a laminate construct 44 to replace the combined functionality of the prior art's PCB (24, FIG. 4) and ceramic substrate base (30, FIG. 4). It also includes an ejection chip and fluid manifold (silicon) 20, as before, and the chip connects electrically to the laminate construct, such as by wire bond 22. As in the initial concept, there remains a tile layer (silicon) 28 interposed between the manifold/chip 20 and the laminate construct and fluid connections "fan-out" from the manifold/chip 20, to the tile, to the laminate construct. Although not shown here, the ports on the back of the tile are mated to the through-hole ports on the laminate construct. Small ports (through holes) are fabricated in the construct as before, such as by drilling or laser cutting. To make the actual electrical connection from the top surface of the ejection chip down to the upper layer of the laminate construct, the construct has a footprint protruding slightly at position 45 beyond a footprint of the tile.

Figure 6:
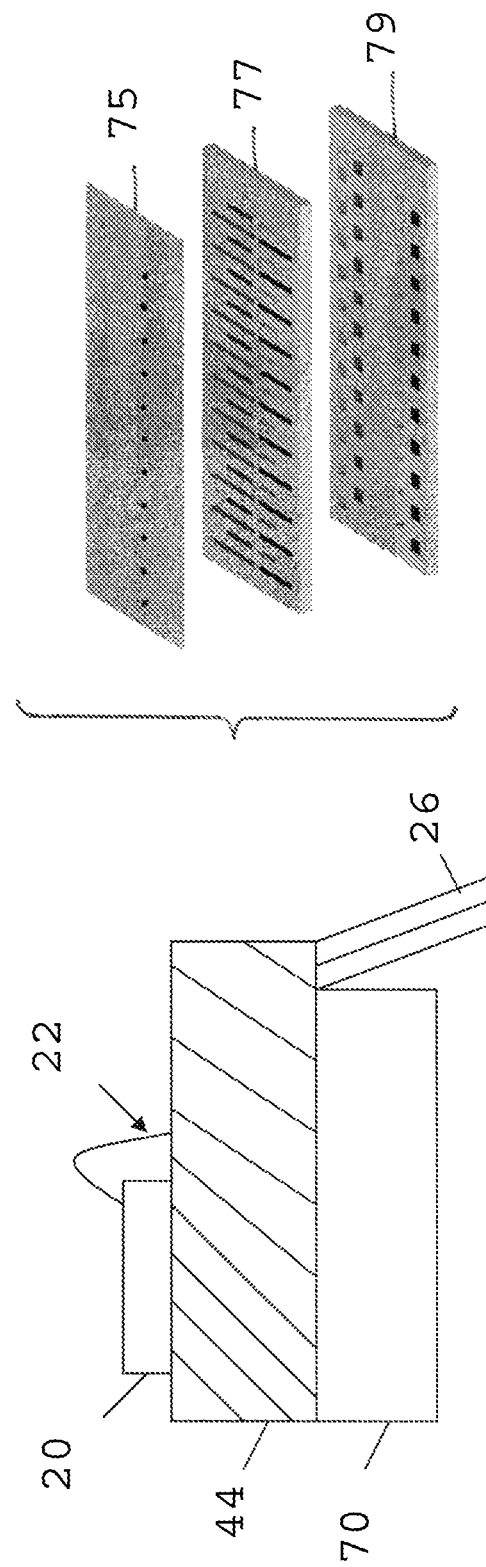

With reference to FIG. 6, an alternate embodiment envisions the laminate construct 44 replacing not only the combined functionality of the prior art's PCB (24, FIG. 4) and ceramic substrate base (30, FIG. 4), but also the tile (28, FIGS. 4 and 5). A plastic manifold 70 is also added in support of the laminate construct 44 to reveal additional structures available with an ejection head. In detail of the laminate construct shown to the right, the construct has small ports for placement in fluid communication with the corresponding ports on the bottom side of the manifold/chip 20. To the extent the channel width on the bottom of the manifold/chip 20 is sufficiently large, then it is possible that the fluidic path in the laminate construct alternatively embodies through holes. For fluidic reasons, the design may dictate keeping an aspect ratio of no more than 2:1 such that a 200 .mu.m channel width would result in a 400 .mu.m laminate thickness with through holes. On the other hand, if the channel widths are smaller (for example, one current embodiment has 80 .mu.m channels), then the laminate will be required to perform some of the fan-out/fluidic path expansion from a top of the laminate to the bottom as it is not likely possible to create a four wiring layer laminate that is wholly less than 160 .mu.m thick. As depicted in the three layers shown on the right side of bracket for the laminate construct 44, the port layer 75, lateral channels 77, and larger ports 79 (fabricated in FIG. 4 in its tile and ceramic layers) may be punched or laser cut in the non-conductive layers (FIG. 2) of the laminate construct prior to a lamination step of creating the entirety of the multiple layers of the laminate construct 44.

Actual instances of crafting the flow features in the laminate construct include instances of the following: 1) etching lateral fluidic channels in metal layers followed by plating; 2) stacking/joining multiple such layers; and 3) adhesively attaching the entirety of the layers (with optional aperture layers interposed). Alternatively, the instances of fabrication might include stamping, routing, drilling, milling, or etching through holes and lateral cuts for fluidic channels in base layers (e.g. FR4) followed by stacking and joining the layers with adhesive layers (e.g. prepreg FR4) as is known in the PCB art. The latter approach is preferable as it does not use metal layers to define fluidic channels thereby avoiding potential corrosion issues.

In the design of FIG. 6, the back of the chip/manifold 20 would be attached to the top of a Stablcor composite laminate. Optionally, depending on the board thickness, a molded plastic manifold layer (in a low CTE material such as a liquid crystal polymer or Shin Etsu KMC-6000HX epoxy molding compound) is attached to the bottom of the Stablcor composite laminate with adhesive to provide some structural rigidity. Later, all of the ports on the back of the Stablcor composite laminate are combined into a single fluidic feature for each color of the ejection chip, tapering from a long slot to a single port on the backside which can be easily connected by way of gasket approach. Wire bonds 22 down to the top surface of the laminate construct can made from either or both sides of the ejection chip (although it is only shown on its right side as oriented in the Figure).

Figure 7:
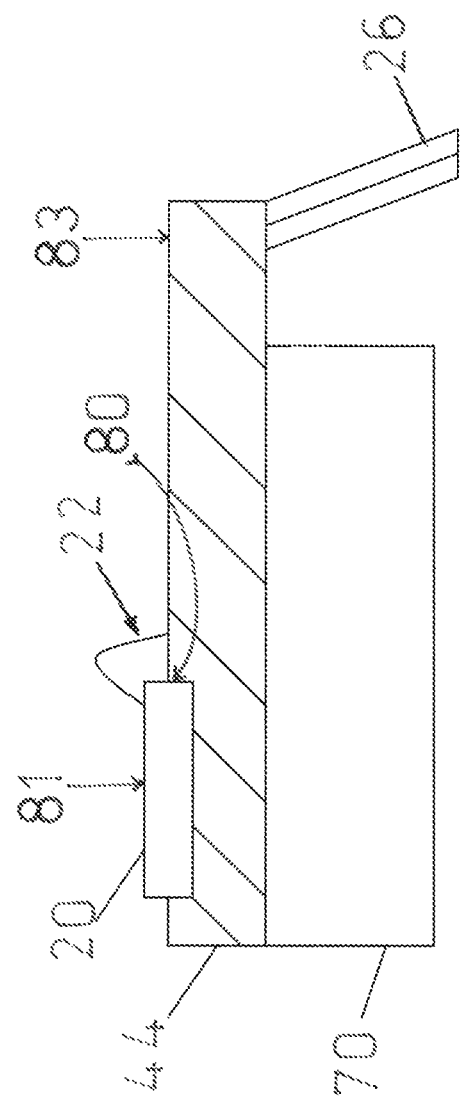

With reference to FIG. 7, still another embodiment of a laminate construct in an ejection head is given. It is similar to that of FIG. 6, except for locating the manifold/chip 20 in a recessed pocket 80 of the laminate construct and directly mounting the two with a die bond material, as in FIG. 2. While not a requirement, mounting in this fashion accomplishes two things. First, the best CTE match between the chip and construct is obtained. Second, the undersurface surface of the chip is mated directly to the highly thermally conductivity Stablcor layer, thereby improving the thermal dissipation through thin bond lines. Even more, the thermal dissipation could be improved if the die bond material 61 included thermally conductive properties, such as those found with silica or boron nitride particles. A depth of the pocket, and thus the height of the top 81 of the manifold/chip 20 above a top 83 of the laminate construct, is made variable. In one instance, the pocket depth is adjustable by varying a number of plies of prepreg used in the construct. The more the top surface of the manifold/chip 20 is made flush with the top of the construct, the more advantage provided in maintenance servicing for an easy wiping transition exists between the chip and construct. Such also eliminates the need for a separate cap, such as a plastic shroud piece as in certain prior art designs.

To create the pocket, routing or punching the upper or top layers of prepreg of the construct are contemplated prior to laminating together its many layers. In initial experiments, the inventors have found that due to the heat and pressures involved in the lamination fabrication process, it may be necessary to maintain the space in the pocket by providing a complementary feature in a press plate (not shown) that prevents the underlying layers from becoming deformed into the pocket space. Also, ceramics can be lapped to provide a nearly perfectly planar surface, whereas PCB materials are less reliable. As such, PCB materials may require a thicker bond line to accommodate the substrate planarity variation.

In other aspects of this embodiment, wire bonds 22 are shown running between the chip and pads on the top layer of the construct. However, electrical pads can be formed in a bottom of the pocket to electrically connect the chip to the laminate construct. This enables a lower height for wire bond loops and a wider encapsulation height-process window.

Figure 8:
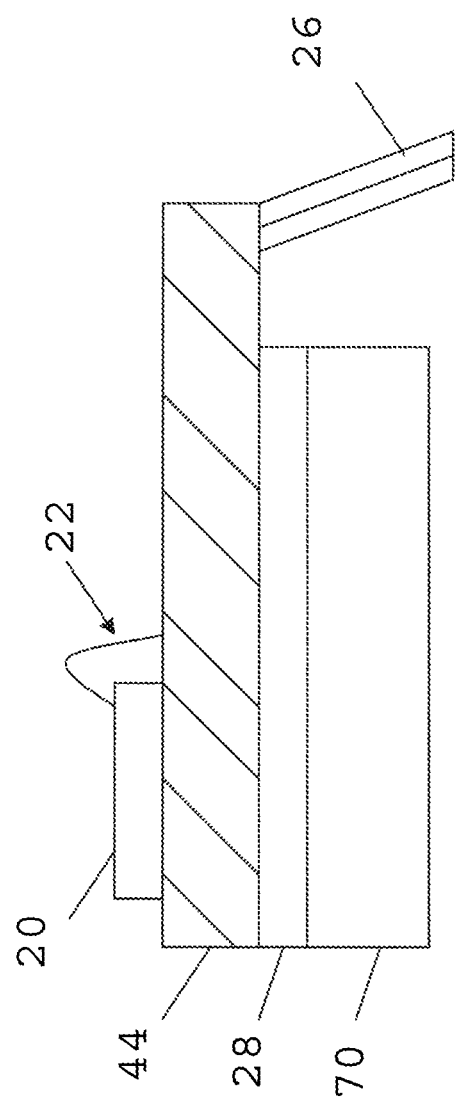

With reference to FIG. 8, still another embodiment of a laminate construct 44 in an ejection head is given. In this design, a relatively thin construct is used and the tile 28 from earlier embodiments is retained. As seen, the tile mates to the backside of the construct 44 to provide an even further lateral expansion or fan-out of fluidic channels downward from the manifold/chip 20. In addition, the plastic manifold serves to provide structural support under the tile and tapering flow features (not shown) for a gasket interconnection.

Figure 9:
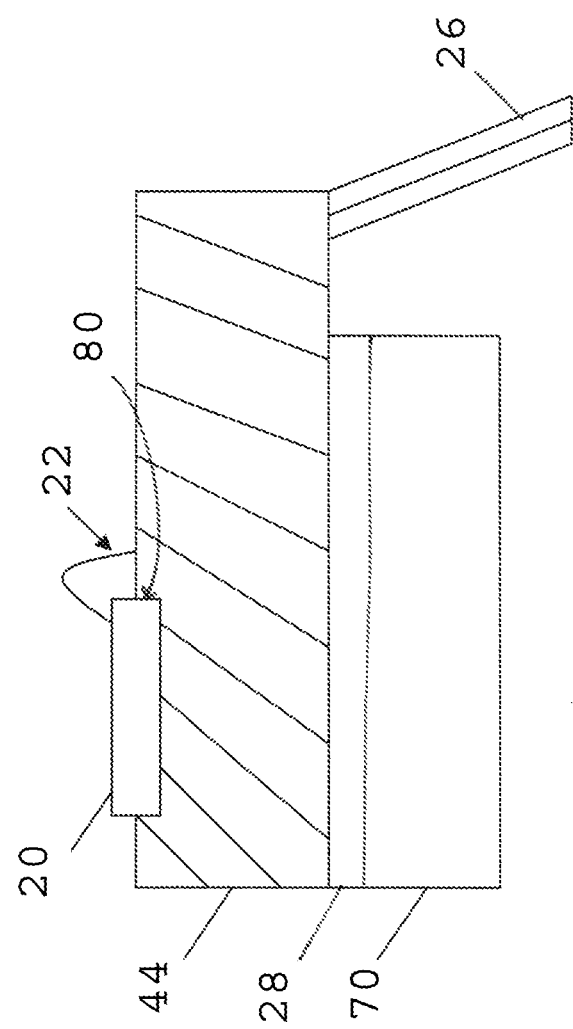

With reference to FIG. 9, multiple features of foregoing designs are provided. Namely, the laminate construct 44 in an ejection head maintains a recessed pocket 80 for the manifold/chip 20 and attaches above a tile 28.

In alternate embodiments, it may be desired to eliminate the manifold from the manifold/chip assembly 20. In such instances, the manifold is eliminated if the adhesive material, and its dispense process used to attach the assembly to the laminate construct, is capable of providing fluidic sealing across very narrow seal surfaces. Since a primary function of the manifold is to provide increased sealing distances on a back or bottom side of the chip would be no longer required, the manifold is expendable. In such situations, the fluid flow features of the laminate construct would require adjusting to directly interface with those of the ejection chip.

Skilled artisans should readily appreciate the embodiments herein present several options for fanning out fluid flow features downward from an ejection chip and making electrical connections to a laminate construct. Layers of the construct and its construction techniques are also revealed as are approaches to its attachment to still other conventional structures in an ejection head. Relevant advantages have been described and other inherent advantages have been made readily apparent.

The foregoing, therefore, is presented for purposes of illustrating the various aspects of the invention. It is not intended to be exhaustive or to limit the claims. Rather, it is chosen to provide the best illustration of the principles of the invention and its practical application to enable one of ordinary skill in the art to utilize the invention, including its various modifications that naturally follow. All such modifications and variations are contemplated within the scope of the invention as determined by the appended claims. Relatively apparent modifications, naturally, include mixing and matching the features of various embodiments with one another, if practical.

What is claimed:

1. A micro-fluid ejection head for use in a micro-fluid ejection device, comprising:
   an ejection chip that expels fluid toward a print media, the ejection chip comprising a fluid feed slot; and
   a laminate construct that supports the ejection chip, the laminate construct comprising:
      a plurality of electrical interconnect layers, at least one of the plurality of interconnect layers being electrically connected to the ejection chip;
      conductive layers, at least one of the conductive layers being vertically stacked between two of the plurality of electrical interconnect layers, the conductive layers comprising carbon fiber; and
      an ink feed slot in fluid communication with the fluid feed slot of the ejection chip, the ink feed slot passing through the electrical interconnect layers and the conductive layers.

2. The micro-fluid ejection head of claim 1, further comprising a tile layer in fluid communication with the ejection chip and the laminate construct.

3. The micro-fluid ejection head of claim 2, wherein the tile layer is disposed between the ejection chip and the laminate construct.

4. The micro-fluid ejection head of claim 2, wherein the tile layer is made of silicon.

5. The micro-fluid ejection head of claim 1, further comprising a manifold that supports the laminate construct.

6. The micro-fluid ejection head of claim 5, wherein the manifold is a plastic manifold.

7. The micro-fluid ejection head of claim 5, wherein the ejection chip is disposed within a recessed pocket of the laminate construct.

8. The micro-fluid ejection head of claim 5, further comprising a tile layer in fluid communication with the ejection chip, the laminate construct and the manifold.

9. The micro-fluid ejection head of claim 8, wherein the tile layer is disposed between the laminate construct and the manifold.

\* \* \* \* \*